United States Patent [19]

Keuneke

[11] Patent Number: 5,783,984
[45] Date of Patent: Jul. 21, 1998

[54] METHOD AND MEANS FOR COMBINING A TRANSFORMER AND INDUCTOR ON A SINGLE CORE STRUCTURE

[75] Inventor: Carl Edward Keuneke, South Whitley, Ind.

[73] Assignee: Hughes Electronics, Los Angeles, Calif.

[21] Appl. No.: 491,554

[22] Filed: Jun. 16, 1995

[51] Int. Cl.⁶ .......................... H01F 21/08; H01F 17/06
[52] U.S. Cl. .......................... 336/155; 336/165; 336/178
[58] Field of Search ............................ 336/155, 216, 336/217, 212, 165, 178

[56] References Cited

U.S. PATENT DOCUMENTS

| | | | |
|---|---|---|---|
| 4,422,056 | 12/1983 | Roberts | 336/215 |
| 4,427,955 | 1/1984 | Roberts | 336/178 |
| 4,613,841 | 9/1986 | Roberts | 336/178 |
| 4,868,732 | 9/1989 | Gillett et al. | 336/212 |
| 5,155,676 | 10/1992 | Spreen | 336/178 |
| 5,335,163 | 8/1994 | Seiersen | 336/178 |
| 5,426,409 | 6/1995 | Johnson | 336/178 |
| 5,461,555 | 10/1995 | Kitajima et al. | 336/160 |

*Primary Examiner*—Cassandra C. Spyrou
*Assistant Examiner*—Daniel Chapik
*Attorney, Agent, or Firm*—Gordon R. Lindeen, III; Michael W. Sales; Wanda K. Denson-Low

[57] ABSTRACT

In a prefer embodiment, an integrated transformer and inductor on a singe core structure to provide an impedance matching function and an inductor in series with the transformer's secondary which includes: a transformer core structure having a primary leg, a secondary leg, and a center leg containing an air gap, said center leg disposed parallel to said primary leg and secondary leg, whereby said air gap provides control of said inductor value; a primary winding on said primary leg; and a secondary winding on said secondary leg.

6 Claims, 4 Drawing Sheets

METHOD AND MEANS FOR COMBINING A TRANSFORMER AND INDUCTOR ON A SINGLE CORE STRUCTURE

BACKGROUND OF THE INVENTION

1. Field of the Invention.

The present invention relates to method and means for matching an electrical device's output impedance to a load impedance and canceling the capacitive reactance of the load at the operating frequency generally and, more particularly, but not by way of limitation, to a method and means which combines, on a single core, the functions of a transformer and an inductor connected in series with the transformer's secondary winding.

2. Background Art.

The magnetic theory controlling the operation of inductors and transformers is well known. The general concepts for combining magnetic functions of inductors and transformers on a single magnetic core structure are also well known.

Integrated transformer/inductor devices have, up to now, taken advantage of a transformer's magnetizing inductance to combine the function of a transformer, and the function of an inductor connected in parallel with the transformer's secondary winding, on a single core structure. Integrated transformer/inductor devices on a single core have, up to now, been dependent on equal magnetic flux amplitude, phase, and waveform characteristics within the two equivalent independent components. Furthermore, since the integrated transformer/inductor device is equivalent to a transformer's secondary connected in parallel with an inductor, when driving capacitive loads, the input impedance is low except at frequencies close to resonant frequency (that frequency where the inductive reactance of the integrated transformer/inductor device's equivalent secondary inductance is equal to the capacitive reactance of the load). For maximum power transfer through an integrated transformer/inductor device, and for cancellation of the load's capacitive reactance as seen at the transformer/inductor device's input, the device is typically designed to operate near its resonant frequency. However, when the transformer/inductor device is driven by switching power amplifiers such as the class "S", or class "D" power amplifiers, these amplifiers contain high frequencies in their outputs as a result of their high frequency electronic switching operation, in addition to the desired signal frequencies at or close to the resonant frequency. A low pass filter is required between the output of the power amplifier and the input of the transformer/inductor device to eliminate high currents, and associated power dissipation at the high frequencies. In some applications, the combination of the conventional integrated transformer/inductor structure and the low pass filter exhibit greater size, weight, and volume than what is otherwise desirable.

Accordingly, it is a principal object of the method and means of the present invention to combine onto a single core structure, the functions of a transformer and an inductor in series with the transformer's secondary winding, for any combination of magnetic flux amplitude, phase, or waveform required of the two independent components.

Another object of the present invention is to eliminate the need for low pass filtering of non-sinusoidal drive signals such as from the output of switching power amplifier ( for example, a square wave drive from a class "S" power amplifier or a PWM drive signal from a class "D" power amplifier) prior to application to the integrated transformer/inductor device.

A further object of the present invention is that the transformer and inductor functions be integrally combined onto a single core structure using only two windings.

An additional object of the present invention is to maintain full control of the equivalent circuit's transformer-turns-ratio.

It is a further object of the present invention to maintain full control of the inductance of the equivalent circuit's inductor.

It is yet another object of the present invention to reduce the volume and weight of the integrated transformer and inductor combination relative to the individual transformer/inductor components and in certain applications relative to the existing conventional integrated structure.

It is yet an additional object of the present invention to improve the efficiency of the integrated transformer and inductor combination relative to the individual transformer/inductor components and in certain applications relative to the existing conventional integrated structure.

It is yet a further object of the present invention to reduce the power dissipation of the integrated transformer and inductor combination relative to the individual transformer/inductor components and in certain applications relative to the existing conventional integrated structure.

Another object of the present invention is to provide combined functions of a transformer and an inductor integrated onto a single core structure which may be conveniently and economically manufactured by present day techniques commonly in use in this industry.

Other objects of the present invention, as well as particular features, elements, and advantages thereof, will be elucidated in, or be apparent from, the description and the accompanying drawing figures.

SUMMARY OF THE INVENTION

The present invention achieves the above objects, among others, by providing, in a preferred embodiment, an integrated transformer and inductor on a singe core structure to provide an impedance matching function and an inductor in series with said transformer's secondary which comprises: a transformer core structure having a primary leg, a secondary leg, and a center leg containing an air gap, said center leg disposed parallel to said primary leg and secondary leg, whereby said air gap provides control of said inductor value; a primary winding on said primary leg; and a secondary winding on said secondary leg.

BRIEF DESCRIPTION OF THE DRAWINGS

Understanding of the present invention and the various aspects thereof will be facilitated by reference to the accompanying drawing figures, submitted for purposes of illustration only and not intended to define the scope of the invention, on which.

DETAILED DESCRIPTION OF THE PREFERRED EMBODIMENTS

Figure 1:
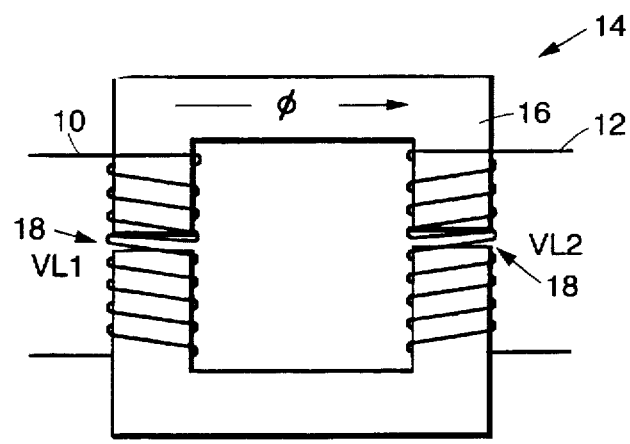
FIG. 1 (prior art) illustrates an integrated transformer and inductor on a single core structure.

Reference should now be made to the drawing figures, on which similar or identical elements are given consistent identifying numerals throughout the various figures thereof, and on which parenthetical references to figure numbers direct the reader to the view(s) on which the element(s) being described is (are) best seen, although the element(s) may be seen also on other views.

FIG. 1 (prior art) illustrates the existing concept of integrated transformer and inductor functions, generally indicated by the reference numeral 14, sharing a single core structure 16. Two windings are used: transformer primary winding 10, and transformer secondary/inductor winding 12. Additionally, air gaps 18 are provided in core 16 to control and maintain the inductance of secondary winding 12. Coupled transformer and inductor combination 14 results in magnetic flux within core 16 being common (equal in amplitude, phase, and characteristics) to both windings 10 and 12.

Figure 2:
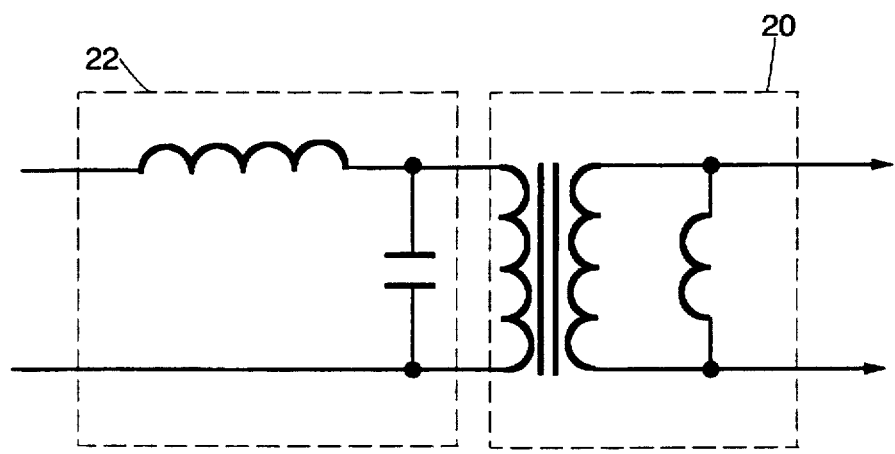
FIG. 2 (prior art) illustrates the equivalent circuit of the integrated transformer and inductor of FIG. 1 including an input filter required when driven by the output of a switching power amplifier (not shown).

FIG. 2 (prior art) illustrates the transformer equivalent circuit for integrated transformer/inductor 14 (FIG. 1), generally indicated by reference numeral 20. Since integrated transformer/inductor structure 14 is equivalent to a transformer and an inductor in parallel to the transformer's secondary, as illustrated in the equivalent circuit, the addition of low pass filter circuit 22 is required when the integrated transformer/inductor is driving capacitive loads, and is in turn driven by an output signal containing undesirable high frequencies (as from switching power amplifiers). Low pass filter 22 operates to eliminate high currents and associated power dissipation from integrated transformer/inductor 14 (FIG. 1).

Figure 3:
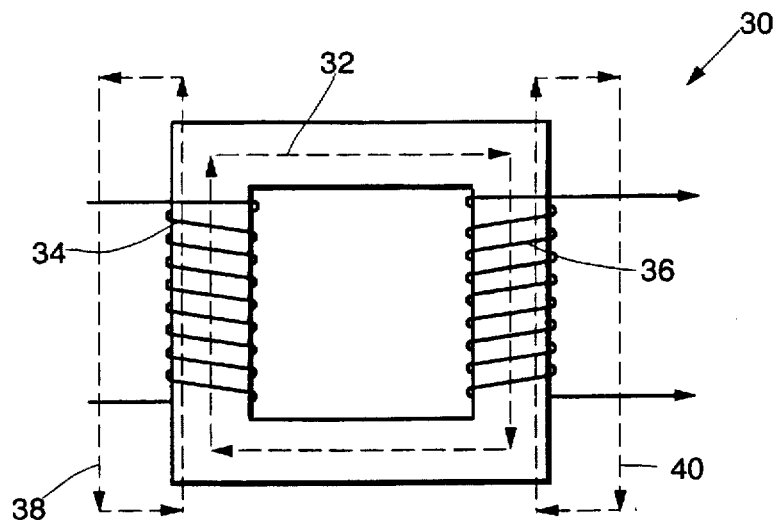
FIG. 3 (prior art) illustrates the magnetic characteristics of a transformer.

FIG. 3 (prior art) illustrates the magnetic characteristics of transformer 30. Ideally, magnetic flux 32 generated by primary winding 34 of transformer 30 will completely couple to secondary winding 36 of the transformer 30. In actual operation, however, a portion of magnetic flux 32 generated by primary winding 34, for example, does not couple to secondary winding 36. The portion of flux that does not couple is designated as primary leakage flux 38. Similarly, a portion of magnetic flux 32 generated by secondary winding 36 does not couple to primary winding 34. This portion of flux that does not couple is designated a secondary leakage flux 40.

Leakage inductance is usually undesirable in transformers as it prevents maximum power transfer from transformer input to output. The loss of power requires a higher input voltage to attain a desired output voltage and associated output power. Transformers are typically designed to minimize leakage flux and thereby leakage inductance.

Figure 4:
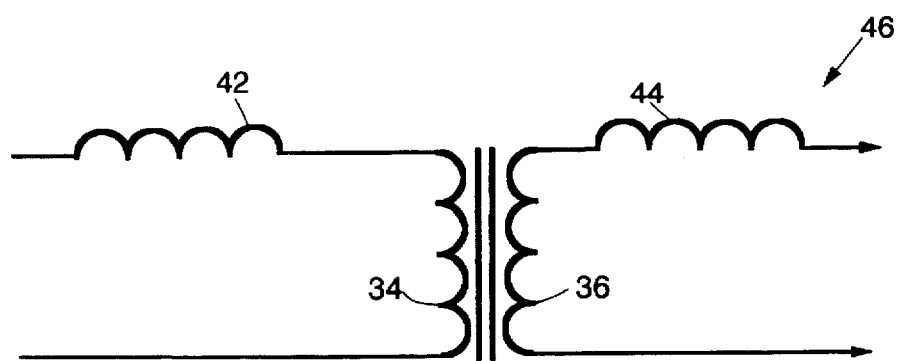
FIG. 4 (prior art) is a view of a transformer equivalent circuit which illustrates primary and secondary leakage inductances generated by primary and secondary leakage fluxes, respectively.

FIG. 4 (prior art) illustrates transformer equivalent circuit 46 for transformer 30 (FIG. 3). Primary leakage flux 38 (FIG. 3) and secondary leakage flux 40 (FIG. 3) develop primary leakage inductance 42 and secondary leakage inductance 44, respectively.

Figure 5:
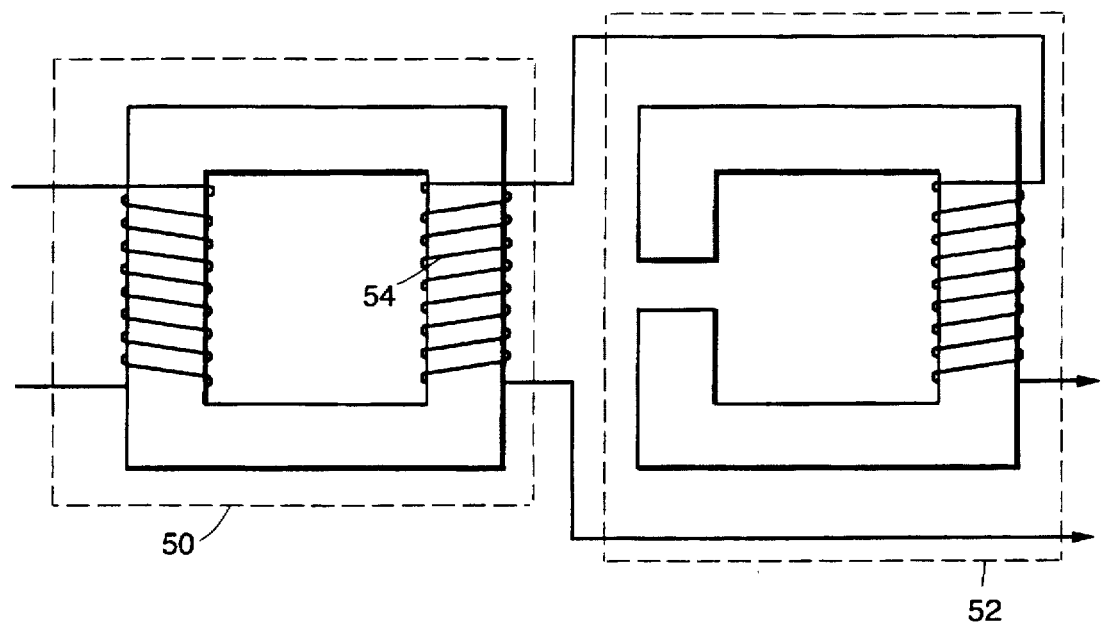
FIG. 5 (prior art) illustrates a transformer element, and an inductor element connected in series with transformer element secondary winding.
Figure 6:
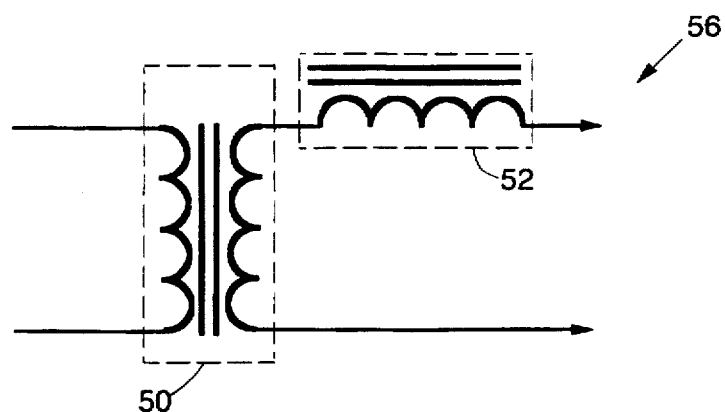
FIG. 6 (prior art) illustrates the equivalent circuit of transformer element and inductor element shown in FIG. 5.

FIG. 5 (prior art) illustrates transformer element 50 and inductor element 52 which is connected in series with secondary winding 54 of transformer element 50, typical of an application whereby a transformer is used to match an electrical device's output impedance to a load impedance. Inductor 52 serves to cancel the capacitive reactance component of the load impedance at a given operating frequency, typically the resonant frequency. Three windings are required in this application FIG. 6 (prior art) illustrates the equivalent circuit 56 of transformer element 50 and series inductor element 52 shown previously in FIG. 5.

In summary, the prior integrated transformer/inductor devices suffer from undesirable leakage inductances which cannot be readily controlled, require additional components to overcome the undesirable effects previously described, and require three windings.

Figure 7:
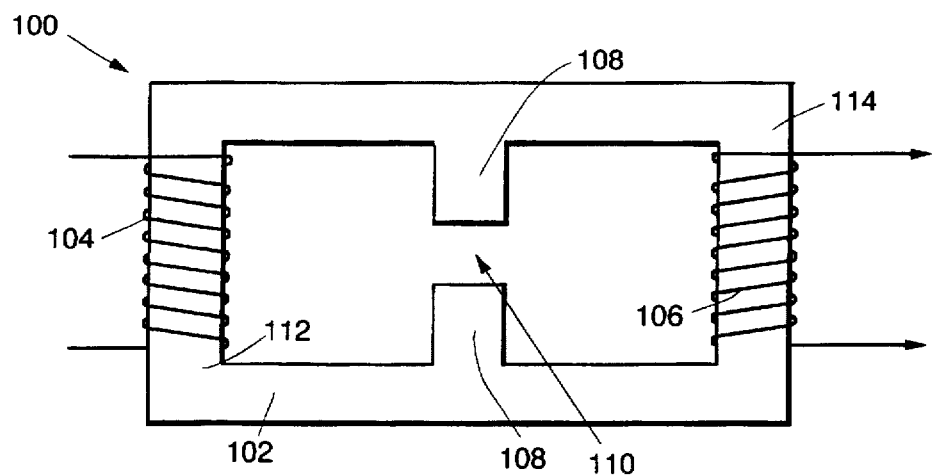
FIG. 7 is a view of the device of the present invention.

Reference should now be made to FIG. 7, which shows transformer/inductor device of the present invention generally indicated by the reference numeral 100, in the preferred embodiment.

Transformer/inductor device 100 includes a single core structure 102, a primary leg 112 upon which primary winding 104 is wound, a secondary leg 114 upon which secondary winding 106 is wound, and a center leg 108 containing air gap 110.

Design equations are given below which support the means and method of the present invention in the preferred embodiment, when being driven with a square wave (e.g., typical output of a class "S" power amplifier) at its resonant frequency, and driving a load consisting of a series capacitance and resistance (typical equivalent circuit of an electroacoustic projector). The design equations presented are specific to the present invention and do not include parasitics such as actual leakage inductance, copper and core loss, effects of fringing flux, etc. The addition of these parasitics to the design equations follows the process similar to that of standard transformer and inductor design.

The turns ratio of the transformer/inductor device to provide a desired impedance matching function is given by $$N_s/N_p = V_{RL}/V_{in}$$

where $N_s$=number of turns of secondary winding 106.

$N_p$=number of turns of primary winding 104.

$V_{RL}$=desired RMS voltage across the load resistance at the resonant frequency.

$V_{in}$=RMS voltage of the signal applied to primary winding 104 at the resonant frequency (=0.9×$V_p$).

$V_p$=RMS voltage of the square wave applied to primary winding 104.

The core area of primary leg 112 is given by the relationship of applied voltage, operating flux density, number of turns, and frequency:

$$A_p = (V_p \times 10^8)/(4.0 \times Freq \times N_p \times B)$$

where $A_p$=cross-sectional area of primary leg 112 (in cm$^2$).

$V_p$=RMS voltage of the square wave applied to primary winding 104.

Freq=frequency of the square wave applied to primary winding 104 (in hertz).

$N_p$=number of turns on primary winding 104.
$B$=desired maximum operating flux density (in gausses).
The core area of secondary leg 114 is given by:

$$A_s = A_p \times (1 + (1/R_L \times 2 \times Pi \times Freq \times C_L))^2)^{1/2}$$

where $A_s$=cross-sectional area of secondary leg 114 (in cm$^2$).
$A_p$=cross-sectional area of primary leg 112 (in cm$^2$).
$R_L$=series resistance of the load (in ohms).
Pi=3.1416.
Freq=frequency of the square wave applied to primary winding 104 (in hertz).
$C_L$=series capacitance of the load (in farads).
The core area of center leg 108 core is given by:

$$A_c = (V_p \times 10^8)/(8 \times Freq \times N_p \times B \times Pi \times Freq \times C_L \times R_L)$$

where $A_c$=cross-sectional area of center leg 108 (in cm$^2$).
$V_p$=RMS voltage of the square wave applied to primary winding 104.
Freq=frequency of the square wave applied to primary winding 104 (in hertz).
$N_p$=number of turns on primary winding 104.
$B$=desired maximum operating flux density (in gausses).
Pi=3.1416.
$C_L$=series capacitance of the load (in farads).
$R_L$=series resistance of the load (in ohms).
The width of air gap 110 in center leg 108 is given by:

$$I_g = (0.4 \times Pi \times 10^{-8} \times N_s^2 \times A_c)/L$$

where $I_g$=width of air gap 110 (in cm).
Pi=3.1416.
$N_s$=number of turns of secondary winding 106.
$A_c$=cross-sectional area of center leg 108 (in cm$^2$).
$L$=desired inductance of the equivalent series inductor (in henries).

Figure 8:
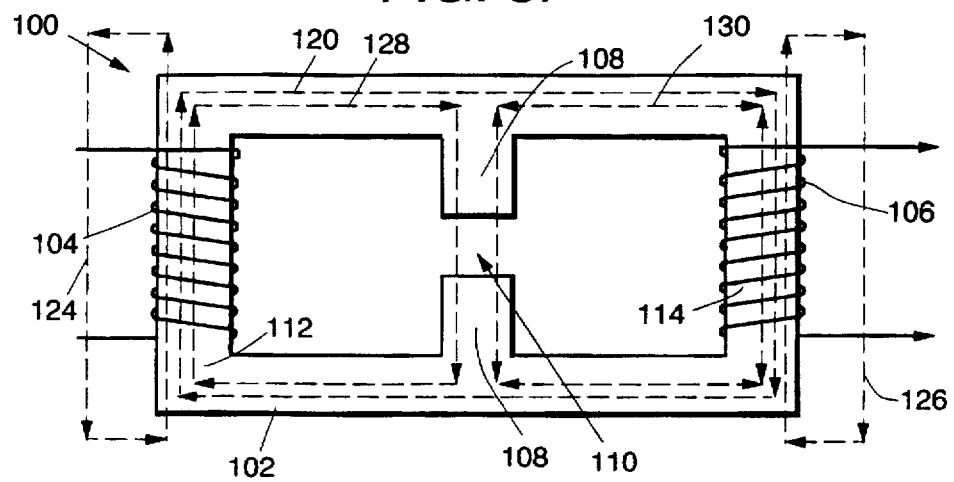
FIG. 8 is a view of the device of the present invention, showing various flux paths.

Reference should now be made to FIG. 8 which shows transformer/inductor device 100 superimposed with magnetic flux 120, which couples primary winding 104 to secondary winding 106, true primary leakage flux 124, true secondary leakage flux 126, primary winding controlled leakage flux 128, and secondary winding controlled leakage flux 130.

Figure 9:
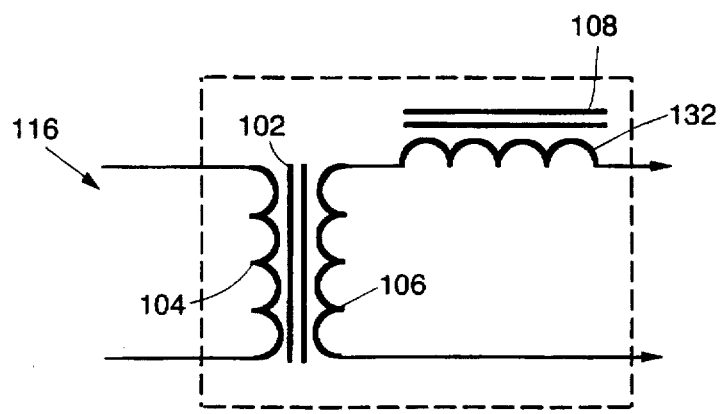
FIG. 9 is an equivalent circuit of the device of the present invention.

Reference should now be made to FIG. 9 which shows an equivalent circuit 116 of device 100. Equivalent circuit 116 is identical to equivalent circuit 56 shown on FIG. 6. Magnetic flux 120 (FIG. 8) which couples primary winding 104 to secondary winding 106 through single core structure 102 provides a transformer function. True primary leakage flux 124 (FIG. 8) and primary controlled leakage flux 128 (FIG. 8), reflected to the secondary, true secondary leakage flux 126 (FIG. 8), and secondary controlled leakage flux 130 (FIG. 8) provide series inductor function 132 of equivalent circuit 116 (FIG. 9).

In practice the ratio of number of turns of primary winding 104 to the number of turns of secondary winding 106 is established to provide desired impedance matching between an electrical device connected to primary winding 104 and a load resistance of a series R/C (Resistive/Capacitive) load device connected to secondary winding 106.

True primary leakage flux 124 is enhanced by primary winding controlled leakage flux 128 and true secondary leakage flux 126 is enhanced by secondary winding controlled leakage flux 130. The width of air gap 110 at center leg 108 is established to provide control of values of primary winding controlled leakage flux 128 and secondary winding controlled leakage flux 130 such that the resultant inductance as reflected to secondary winding 106 is the desired value of the series inductor function.

It will thus be seen that the objects set forth above, among those elucidated in, or made apparent from, the preceding description, are efficiently attained and, since certain changes may be made in the above construction without departing from the scope of the invention, it is intended that all matter contained in the above description or shown on the accompanying drawing figures shall be interpreted as illustrative only and not in a limiting sense.

It is also to be understood that the following claims are intended to cover all of the generic and specific features of the invention herein described and all statements of the scope of the invention which, as a matter of language, might be said to fall therebetween.

I claim:

1. An integrated transformer and inductor on a monolithic core structure to provide an impedance matching function and an inductor in series with a secondary of said transformer which comprises:

(a) a transformer core structure having a primary leg, a secondary leg, and a center leg containing an air gap, whereby said air gap provides control of an inductor value;

(b) a primary winding on said primary leg; and (c) a secondary winding on said secondary leg wherein a secondary-to-primary turns ratio of said primary windings is determined by $$N_s/N_p = V_{Rl}/V_{in}$$

where $N_s$=a number of turns of said secondary winding,
   $N_p$=a number of turns of said primary winding,
   $V_{Rl}$=a desired RMS voltage across a load resistance at a resonant frequency, and
   $V_{in}$=an RMS voltage of a signal applied to said primary winding at said resonant frequency.

2. An integrated transformer and inductor on a monolithic core structure to provide an impedance matching function and an inductor in series with a secondary of said transformer which comprises:

(a) a transformer core structure having a primary leg, a secondary leg, and a center leg containing an air gap, whereby said air gap provides control of an inductor value;

(b) a primary winding on said primary leg; and (c) a secondary winding on said secondary leg wherein a core area of said primary leg is determined by $$A_p = (V_p \times 10^8)/(4.0 \times Freq \times N_p \times B)$$

where $A_p$=a cross-sectional area of said core's primary leg (in cm$^2$),
   $V_p$=an RMS voltage of a square wave applied to said primary winding,
   Freq=a frequency of a square wave applied to said primary winding (in hertz),
   $N_p$=a number of turns on said primary winding, and
   $B$=a desired maximum operating flux density (in gausses).

3. An integrated transformer and inductor on a monolithic core structure to provide an impedance matching function and an inductor in series with a secondary of said transformer which comprises:

(a) a transformer core structure having a primary leg, a secondary leg, and a center leg containing an air gap, whereby said air gap provides control of an inductor value;

(b) a primary winding on said primary leg; and (c) a secondary winding on said secondary leg wherein a core area of said secondary leg is determined by $$A_s = A_p \times (1 + (1/R_f \times 2 \times Pi \times Freq \times C_l))^2)^{1/2}$$

where $A_s$ = a cross-sectional area of said core's secondary leg (in cm$^2$),
   $A_p$ = a cross-sectional area of said core's primary leg (in cm$^2$),
   $R_f$ = a series resistance of a load (in ohms),
   Pi = 2.1416,
   Freq = a frequency of a square wave applied to said primary winding (in hertz), and
   $C_f$ = a series capacitance of a load (in farads).

4. An integrated transformer and inductor on a monolithic core structure to provide an impedance matching function and an inductor in series with a secondary of said transformer which comprises:

(a) a transformer core structure having a primary leg, a secondary leg, and a center leg containing an air gap, whereby said air gap provides control of an inductor value;

(b) a primary winding on said primary leg; and (c) a secondary winding on said secondary leg wherein a core of said center leg is determined by $$A_c = (V_p \times 10^8)/(8 \times Freq \times N_p \times B \times Pi \times Freq \times C_l \times R_l)$$

where $A_c$ = a cross-sectional areas of said core's center leg (in cm$^2$),
   $V_p$ = an RMS voltage of a square wave applied to said primary winding,
   Freq = a frequency of said square wave applied to said primary winding (in hertz),
   $N_p$ = a number of turns on said primary winding,
   B = a desired maximum operating flux density (in gausses),
   Pi = 2.1416,
   $C_f$ = a series capacitance of a load (in farads), and
   $R_f$ = a series resistance of said load (in ohms).

5. An integrated transformer and inductor on a monolithic core structure to provide an impedance matching function and an inductor in series with a secondary of said transformer which comprises:

(a) a transformer core structure having a primary leg, a secondary leg, and a center leg containing an air gap, whereby said air gap provides control of an inductor value;

(b) a primary winding on said primary leg; and (c) a secondary winding on said secondary leg wherein a width of said air gap is determined by $$I_g = (0.4 \times Pi \times 10^{-8} \times N_s^2 \times A_c)/L$$

where $I_g$ = said width of said air gap (in cm),
   Pi = 2.1416,
   $N_s$ = a number of turns of said secondary winding,
   $A_c$ = a cross-sectional area of said center leg (in cm$^2$), and
   L = a desired inductance of an equivalent series inductor (in henries).

6. A method of providing an integrated transformer and inductor on a monolithic core structure to provide an impedance matching function and an inductor in series with a secondary of said transformer which comprises:

(a) providing a transformer core structure having a primary leg, a secondary leg, and a center leg containing an air gap, whereby said air gap provides control of said inductor value;

(b) establishing a core area of said primary leg as given by $$A_p = (V_p \times 10^8)/(4.0 \times Freq \times N_p \times B)$$

where $A_p$ = a cross-sectional area of said primary leg (in cm$^2$),
   $V_p$ = an RMS voltage of a square wave applied to said primary winding,
   Freq = a frequency of said square wave applied to said primary winding (in hertz),
   $N_p$ = a number of turns on said primary winding, and
   B = a desired maximum operating flux density (in gausses);

(c) establishing a core area of said secondary leg as given by $$A_s = A_p \times (1 + (1/R_L \times 2 \times Pi \times Freq \times C_L))^2)^{1/2}$$

where $A_s$ = a cross-sectional area of said secondary leg (in cm$^2$),
   $A_p$ = a cross-sectional area of said primary leg (in cm$^2$),
   $R_L$ = a series resistance of a load (in ohms),
   Pi = 3.1416 and,
   Freq = a frequency of a square wave applied to said primary winding (in hertz),
   $C_L$ = a series capacitance of said load (in farads);

(d) establishing a core area of said center leg according as given by $$A_c = (V_p \times 10^8)/(8 \times Freq \times N_p \times B \times Pi'Freq \times C_L \times R_L)$$

where $A_c$ = a cross-sectional area of said core's center leg (in cm$^2$),
   $V_p$ = an RMS voltage of a square wave applied to said primary winding,
   Freq = a frequency of said square wave applied to said primary winding (in hertz),
   $N_p$ = a number of turns on said primary winding,
   B = a desired maximum operating flux density (in gausses),
   Pi = 3.1416,
   $C_L$ = a series capacitance of a load (in farads), and
   $R_L$ = a series resistance of said load (in ohms).

(e) establishing a width of said air gap according to the equation $$I_g = (0.4 \times Pi \times 10^{-8} \times N_s^2 \times A_c)/L$$

where $I_g$ = an air gap width of said center leg (in cm),
   Pi = 3.1416,
   $N_s$ = a number of turns of said secondary winding,
   $A_c$ = a cross-sectional area of said center leg (in cm$^2$), and L = a desired inductance of an equivalent series inductor (in henries); and (f) winding a primary winding on said primary leg and a secondary winding on said secondary leg whereby a secondary-to-primary turns ratio of said primary and secondary windings is given by $$N_s N_p = V_{RL}/V_{in}$$

where $N_s$ = a number of turns of said secondary winding, $N_p$ = a number of turns of said primary winding, $V_{RL}$ = a desired RMS voltage across a load resistance at a resonant frequency, $V_{in}$ = an RMS voltage of a signal applied to said primary winding at said resonant frequency (= $0.9 \times V_p$ for $V_{in}$ = square wave), and $V_p$ = an RMS voltage of said square wave applied to said primary winding.

* * * * *